(12) United States Patent
Lee et al.

(10) Patent No.: US 11,189,560 B2
(45) Date of Patent: Nov. 30, 2021

(54) SEMICONDUCTOR DEVICE COMPRISING ETCH STOP LAYER OVER DIELECTRIC LAYER AND METHOD OF MANUFACTURE

(71) Applicant: TAIWAN SEMICONDUCTOR MANUFACTURING COMPANY LIMITED, Hsin-Chu (TW)

(72) Inventors: Shao-Kuan Lee, Kaohsiung (TW); Hai-Ching Chen, Hsinchu (TW); Hsin-Yen Huang, New Taipei (TW); Shau-Lin Shue, Hsinchu (TW); Cheng-Chin Lee, Taipei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 77 days.

(21) Appl. No.: 16/552,937

(22) Filed: Aug. 27, 2019

(65) Prior Publication Data

US 2021/0066187 A1    Mar. 4, 2021

(51) Int. Cl.
*H01L 23/522*    (2006.01)
*H01L 23/532*    (2006.01)
*H01L 21/768*    (2006.01)

(52) U.S. Cl.
CPC ...... *H01L 23/5226* (2013.01); *H01L 21/7682* (2013.01); *H01L 21/76802* (2013.01); *H01L 21/76831* (2013.01); *H01L 21/76877* (2013.01); *H01L 23/53295* (2013.01)

(58) Field of Classification Search
USPC ........................................................... 257/774
See application file for complete search history.

(56) References Cited

U.S. PATENT DOCUMENTS

| | | | |
|---|---|---|---|
| 2015/0076705 A1* | 3/2015 | Singh | H01L 21/76835 257/774 |
| 2016/0093566 A1* | 3/2016 | Ting | H01L 23/5329 257/774 |
| 2016/0141206 A1* | 5/2016 | Bouche | H01L 21/76897 257/774 |
| 2018/0286934 A1* | 10/2018 | Zhao | H01L 51/56 |
| 2021/0005548 A1* | 1/2021 | Lee | H01L 21/76849 |

* cited by examiner

*Primary Examiner* — Nduka E Ojeh
(74) *Attorney, Agent, or Firm* — Cooper Legal Group, LLC

(57) ABSTRACT

A semiconductor device includes a first conductive feature, a second conductive feature, and a first dielectric layer positioned between the first conductive feature and the second conductive feature. An etch stop layer is over the first dielectric layer. A cap layer is over the first conductive feature, the second conductive feature, and the etch stop layer.

20 Claims, 5 Drawing Sheets

SEMICONDUCTOR DEVICE COMPRISING ETCH STOP LAYER OVER DIELECTRIC LAYER AND METHOD OF MANUFACTURE

BACKGROUND

Contacts are used to make electrical connections in or among different features in a semiconductor device. A contact, for example, is used to connect one metal layer to another metal layer or another device layer, where the metal layers are otherwise electrically isolated from one another, such as by an insulating or dielectric material separating the metal layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
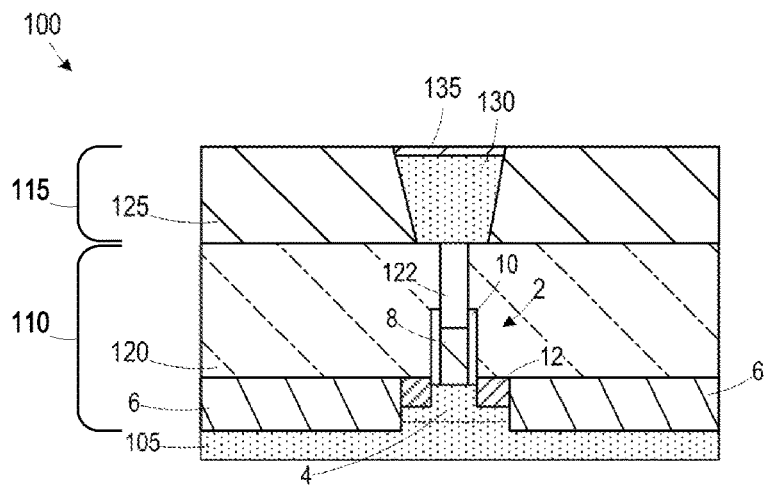
FIGS. 1-10 are illustrations of a semiconductor device at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor device are provided herein. In some embodiments, a blocking layer is selectively formed on a conductive feature, such as a metal feature, and an etch stop layer is selectively formed on a dielectric layer adjacent the conductive feature. The etch stop layer reduces the likelihood of punch through during a subsequent etch process to form a contact in a metallization layer over the conductive feature that interfaces with the conductive feature.

Turning to FIG. 1, a plurality of layers used in the formation of a semiconductor device 100 are illustrated, in accordance with some embodiments. The plurality of layers is formed over a semiconductor layer 105. In some embodiments, the semiconductor layer 105 is part of a substrate comprising at least one of an epitaxial layer, a single crystalline semiconductor material such as, but not limited to Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon. In some embodiments, the plurality of layers comprises a device layer 110 and a first metallization layer 115. In some embodiments, the device layer 110 comprises integrated circuit elements, such as a FinFET transistor 2. In some embodiments, the device layer 110 includes other circuit elements such as planar transistors, capacitors, resistors, or other suitable devices, which are not individually illustrated. In some embodiments, the first metallization layer 115 represents a layer in which interconnections are made between layers of the semiconductor device 100 positioned under the first metallization layer 115 and layers of the semiconductor device 100 positioned over the first metallization layer 115. In some embodiments, one or more metallization layers are formed between the device layer 110 and the first metallization layer 115. Thus, the first metallization layer 115 may be an M1 layer (i.e., a first metallization layer closest to the device layer 110) or an Mx layer, where x is in integer greater than or equal to 2.

In some embodiments, a fin 4 is formed in the semiconductor layer 105 by etching trenches in the semiconductor layer 105 using a patterned hard mask. Thus, the fin 4 is formed from the semiconductor layer 105. In some embodiments, the fin 4 is formed, such as grown, over the semiconductor layer 105. In general, the fin 4 defines an active region for forming devices, such as the FinFET transistor 2. In some embodiments, an isolation structure 6, such as shallow trench isolation (STI), is formed adjacent the FinFET transistor 2 to isolate the FinFET transistor 2 from adjacent devices by forming a recess in the semiconductor layer 105 and filling the recess with a dielectric material. In some embodiments, the isolation structure 6 comprises silicon oxide or other suitable materials.

In some embodiments, a gate structure 8 is formed over the fin 4. According to some embodiments, the gate structure 8 is formed by forming a sacrificial gate structure comprising a sacrificial gate dielectric layer, a sacrificial polysilicon layer, and a hard mask layer over the fin 4 and the isolation structure 6. In some embodiments, a patterning process is performed to pattern the hard mask layer corresponding to the pattern of gate structures to be formed, and an etch process is performed using the patterned hard mask layer to etch the sacrificial polysilicon layer and the sacrificial gate dielectric layer to define the sacrificial gate structure. In some embodiments, remaining portions of the hard mask layer form a cap layer over the sacrificial gate structure. In some embodiments, the sacrificial gate structure is later replaced with the gate structure 8 comprising a gate dielectric layer and a gate electrode (not separately shown).

In some embodiments, the gate dielectric layer comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2. In some embodiments, the gate dielectric layer comprises a native oxide layer formed by exposure of the semiconductor device 100 to oxygen at various points in the process flow, causing the formation of silicon dioxide on exposed surfaces of the fin 4. In some embodiments, an additional layer of dielectric material, such as silicon dioxide, a high-k dielectric material, or other suitable material, is formed over the native oxide to form the gate dielectric layer.

In some embodiments, the gate electrode comprises a barrier layer, one or more work function material layers, a seed layer, a metal fill layer, or other suitable layers. In some embodiments, the metal fill layer comprises tungsten (W) or other suitable material. In some embodiments, the replacement gate dielectric layer and the one or more layers of the gate electrode are deposited by at least one of atomic layer deposition (ALD), physical vapor deposition (PVD), chemical vapor deposition (CVD), or other suitable processes.

In some embodiments, a sidewall spacer 10 is formed adjacent the gate structure 8. In some embodiments, the sidewall spacer 10 is formed by depositing a spacer layer over the gate structure 8 and performing an anisotropic etch process to remove horizontal portions of the spacer layer. In some embodiments, the sidewall spacer 10 comprises silicon nitride or other suitable materials.

In some embodiments, source/drain regions 12 are formed in the fin 4 after forming the gate structure 8. For example, in some embodiments, portions of the fin 4 are doped through an implantation process to form source/drain regions 12 in the fin 4. In some embodiments, an etch process is performed to recess the fin 4 adjacent the sidewall spacer 10 and an epitaxial growth process is performed to form the source/drain regions 12.

In some embodiments, the device layer 110 comprises a dielectric layer 120. In some embodiments, the dielectric layer 120 comprises silicon dioxide or a low-k material. In some embodiments, the dielectric layer 120 comprises one or more layers of low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the materials for the dielectric layer 120 comprise at least one of Si, 0, C, or H, such as SiCOH and SiOC, or other suitable materials. Organic material such as polymers may be used for the dielectric layer 120. In some embodiments, the dielectric layer 120 comprises one or more layers of a carbon-containing material, organo-silicate glass, a porogen-containing material, or combinations thereof. The dielectric layer 120 comprises nitrogen in some embodiments. In some embodiments, the dielectric layer 120 is formed by using, for example, at least one of plasma-enhanced CVD (PECVD), low pressure CVD (LPCVD), atomic layer CVD (ALCVD), or a spin-on coating technology.

In some embodiments, a gate contact 122 is formed in the dielectric layer 120 to contact the gate structure 8 or a gate electrode of the gate structure 8. In some embodiments, the gate contact 122 is formed by using a patterned etch mask to etch a recess in the dielectric layer 120 to expose the gate structure 8 and forming a conductive material in the recess. In some embodiments, the conductive material comprises tungsten, aluminum, copper, cobalt, or other suitable material. In some embodiments, the gate contact 122 comprises a plurality of layers, such as a barrier layer, a seed layer, and a conductive fill layer.

In some embodiments, the first metallization layer 115 comprises a dielectric layer 125. In some embodiments, the dielectric layer 125 comprises silicon dioxide or a low-k material. In some embodiments, the dielectric layer 125 comprises one or more layers of low-k dielectric material. In some embodiments, the materials for the dielectric layer 125 comprise at least one of Si, 0, C, or H, such as SiCOH and SiOC, or other suitable materials. Organic material such as polymers may be used for the dielectric layer 125. In some embodiments, the dielectric layer 125 comprises one or more layers of a carbon-containing material, organo-silicate glass, a porogen-containing material, or combinations thereof. The dielectric layer 125 comprises nitrogen in some embodiments. In some embodiments, the dielectric layer 125 is formed by using, for example, at least one of plasma-enhanced chemical vapor deposition (PECVD), low pressure CVD (LPCVD), atomic layer CVD (ALCVD), or a spin-on coating technology. In some embodiments, the dielectric layer 125 comprises a same material composition as the dielectric layer 120. In some such embodiments, an etch stop layer may be formed between the dielectric layer 120 and the dielectric layer 125 to provide etch control when forming a conductive feature 130 as described below. In some embodiments, the material composition of the dielectric layer 125 is selected to have a different etch selectivity relative to the dielectric layer 120. In some such embodiments, the dielectric layer 125 can directly contact the dielectric layer 120.

In some embodiments, a conductive feature 130 is positioned in the dielectric layer 125 contacting the gate contact 122. In some embodiments, the conductive feature 130 comprises a metal. In some embodiments, the metal comprises tungsten, aluminum, copper, cobalt, or other suitable material. In some embodiments, the conductive feature 130 comprises a silicide material. In some embodiments, the conductive feature 130 comprises a plurality of layers, such as a barrier layer, a seed layer, and a conductive fill layer. In some embodiments, the conductive feature 130 comprises a line feature having, in a horizontal plane, a width (extending left and right on the page) and an axial length (extending into and out of the page) greater than the width. In some embodiments, the conductive feature 130 comprises a via feature having, in a horizontal plane, a width-to-length ratio less than about 5. In some embodiments, the conductive feature 130 is formed using a damascene process by using a patterned etch mask to etch a recess in the dielectric layer 125 and filling the recess with a material of the conductive feature 130. In some embodiments, the material of the conductive feature 130 overfills the recess and a planarization process is performed to remove portions outside the recess. In some embodiments, an etch process is performed to recess the conductive feature 130 and a deposition process is performed to form a cap layer 135 over the conductive feature 130. In some embodiments, the cap layer 135 comprises SiN, AlO, or other suitable material.

Figure 2:
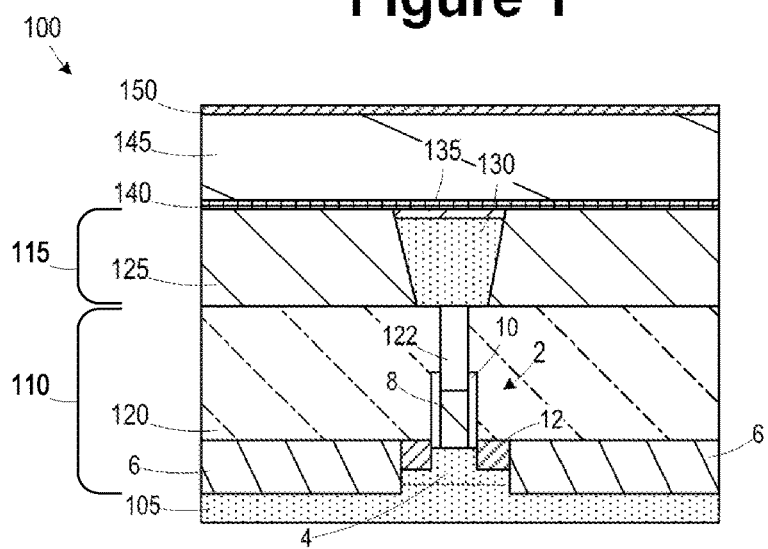

Referring to FIG. 2, a glue layer 140 is formed over the dielectric layer 125 and the cap layer 135, a conductive layer 145 is formed over the glue layer 140, and a hard mask layer 150 is formed over the conductive layer 145, in accordance with some embodiments. In some embodiments, the glue layer 140 comprises TaO, TiO, TiN, or other suitable material. In some embodiments, the glue layer 140 is formed by at least one of CVD, LPCVD, PECVD, ultra-high vacuum CVD (UHVCVD), reduced pressure CVD (RPCVD), ALD, PVD, pulsed laser deposition, sputtering, evaporative deposition, vapor phase epitaxy (VPE), molecular beam epitaxy (MBE), liquid phase epitaxy (LPE), or other suitable techniques. In some embodiments, the conductive layer 145 comprises tungsten, aluminum, or other suitable material. In some embodiments, the conductive layer 145 is formed at least one of CVD, ALD, PVD, pulsed laser deposition, sputtering, evaporative deposition, electroplating, electroless plating, or other suitable techniques. In some embodiments, the hard mask layer 150 comprises silicon nitride or other suitable materials.

Figure 3:
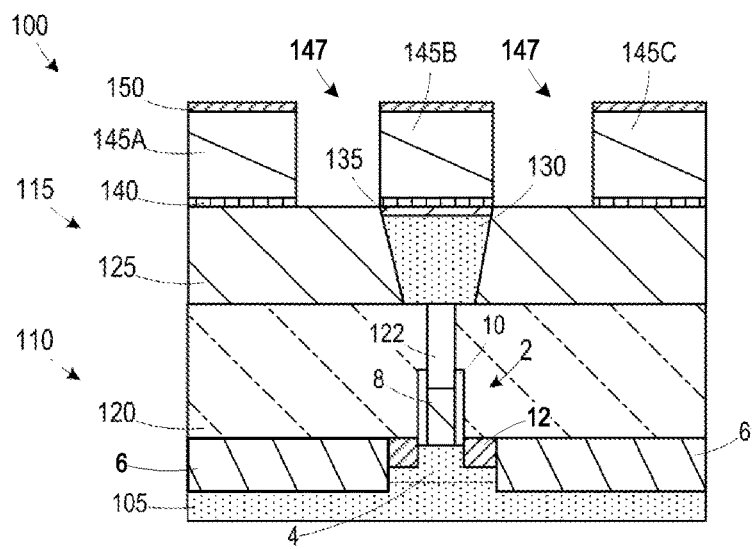

Referring to FIG. 3, the conductive layer 145 is patterned to define conductive features 145A, 145B, 145C, in accordance with some embodiments. In some embodiments, the conductive features 145A, 145B, 145C comprise line features. In some embodiments, the line features have an axial length running into the page in the illustration of FIG. 3. In some embodiments, recesses 147 are defined between the conductive features 145A, 145B, 145C due to the patterning of the conductive layer 145. In some embodiments, at least one of the conductive features 145A, 145B, 145C overlies the conductive feature 130.

In some embodiments, the conductive layer 145 is patterned using a subtractive etch process by forming one or more layers of a photolithography stack. In some embodiments, the photolithography stack comprises a bottom anti-reflective coating (BARC) layer formed over the hard mask layer 150. In some embodiments, the BARC layer is a polymer layer that is applied using a spin-on coating process. In some embodiments, the photolithography stack comprises an organic planarization layer (OPL) formed over the BARC layer. In some embodiments, the OPL layer comprises a photo-sensitive organic polymer that is applied using a spin-on coating process. In some embodiments, the OPL layer comprises a dielectric layer. In some embodiments, the photolithography stack comprises a photoresist layer over the OPL layer. In some embodiments, the photoresist layer comprises an electromagnetic radiation sensitive material and properties, such as solubility, of the photoresist layer are affected by electromagnetic radiation. The photoresist layer is either a negative photoresist or a positive photoresist. In some embodiments, portions of the OPL layer are also irradiated by the electromagnetic radiation that patterns the photoresist layer to change the etch selectivity of the irradiated portions of the OPL layer with respect to non-irradiated portions. In some embodiments, the photoresist layer is exposed using a radiation source and a reticle to define a pattern in the photoresist layer. In some embodiments, portions of the photoresist layer are removed to define a patterned photoresist layer. In some embodiments, the underlying OPL layer and BARC layer are etched using the patterned photoresist layer as a template to form a patterned mask over the hard mask layer 150, and an etch process is performed to pattern the hard mask layer 150. In some embodiments, the photolithography stack is removed and an etch process is performed using the patterned hard mask layer 150 to etch the conductive layer 145 to define the conductive features 145A, 145B, 145C. In some embodiments, forming the conductive features 145A, 145B, 145C using a subtractive etch process as opposed to a damascene process allows the formation of conductive features with reduced pitch and mitigates issues with poor gap-filling of damascene recesses with metals and damage to low-k materials during etching of the damascene recesses.

Figure 4:
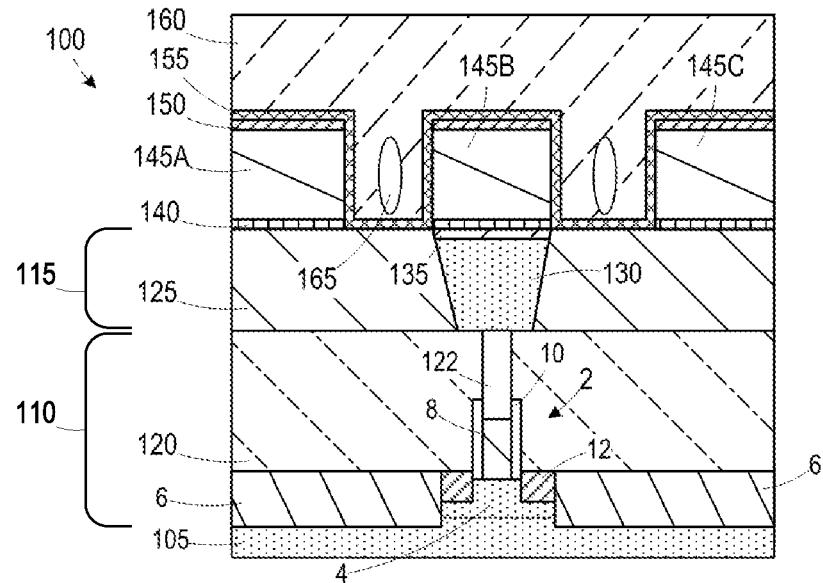

Referring to FIG. 4, an encapsulation layer 155 is formed over the conductive features 145A, 145B, 145C, and a dielectric layer 160 is formed over the encapsulation layer 155, in accordance with some embodiments. In some embodiments, the encapsulation layer 155 and the dielectric layer 160 are formed within the recesses 147 defined between respective conductive features 145A, 145B, 145C. In some embodiments, the encapsulation layer 155 is adjacent bottom surfaces of the conductive features 145A, 145B, 145C and sidewall surfaces of the conductive features 145A, 145B, 145C. In some embodiments, the encapsulation layer 155 is formed such that sidewalls of the dielectric layer 160 disposed within the recesses 147 are spaced apart from sidewalls of the conductive features 145A, 145B, 145C by the encapsulation layer 155. In some embodiments, the encapsulation layer 155 is formed such that bottom surfaces of the dielectric layer 160 disposed within the recesses 147 are spaced apart from a top surface of the dielectric layer 125 by the encapsulation layer 155.

In some embodiments, the encapsulation layer 155 comprises SiN, TaN, TiN, or other suitable material. In some embodiments, the encapsulation layer 155 is formed at least one of CVD, ALD, PVD, pulsed laser deposition, sputtering, evaporative deposition, electroplating, electroless plating, or other suitable techniques. In some embodiments, the encapsulation layer 155 has a thickness of between about 1 nm and 5 nm. In some embodiments, the dielectric layer 160 comprises one or more layers of low-k dielectric material. In some embodiments, the materials for the dielectric layer 160 comprise at least one of Si, O, C, or H, such as SiCOH and SiOC, or other suitable materials. Organic material such as polymers may be used for the dielectric layer 160. In some embodiments, the dielectric layer 160 comprises one or more layers of a carbon-containing material, organo-silicate glass, a porogen-containing material, or combinations thereof. The dielectric layer 160 comprises nitrogen in some embodiments. In some embodiments, the dielectric layer 160 is formed by using, for example, at least one of PECVD, LPCVD, ALCVD, or a spin-on coating technology. In some embodiments, the dielectric layer 160 comprises a same material composition as at least one of the dielectric layer 120 or the dielectric layer 125. In some embodiments, the material composition of the dielectric layer 160 is different than the material composition of the dielectric layer 120 and the dielectric layer 125. In some embodiments, due to the aspect ratio of the conductive features 145A, 145B, 145C, air gaps 165 form in the dielectric layer 160 during the deposition process. In some embodiments, the air gaps 165 reduce the capacitance between the conductive features 145A, 145B, 145C.

Figure 5:
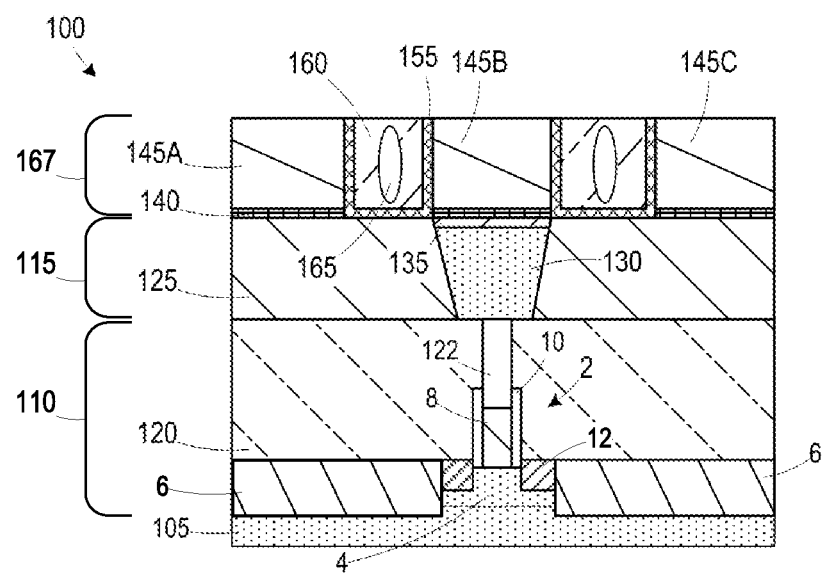

Referring to FIG. 5, portions of the dielectric layer 160 positioned over the conductive features 145A, 145B, 145C are removed, in accordance with some embodiments. In some embodiments, a planarization process is performed to remove the portions of the dielectric layer 160 over the conductive features 145A, 145B, 145C. In some embodiments, portions of the encapsulation layer 155 and the hard mask layer 150 positioned over the conductive features 145A, 145B, 145C are removed during removal of the portions of the dielectric layer 160. In some embodiments, top surfaces of the conductive features 145A, 145B, 145C are exposed during removal of the portions of the dielectric layer 160. In some embodiments, the conductive features 145A, 145B, 145C, the remaining portion of the encapsulation layer 155, and the dielectric layer 160 define a second metallization layer 167.

Figure 6:
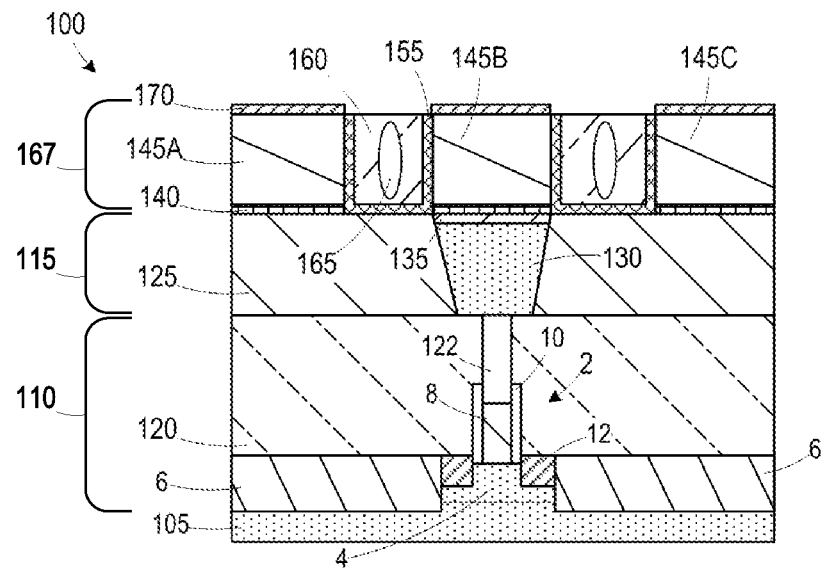

Referring to FIG. 6, a blocking layer 170 is selectively formed over the conductive features 145A, 145B, 145C, in accordance with some embodiments. In some embodiments, the blocking layer 170 comprises a self-assembly monolayer or another Si—O—C—H monolayer material that forms on metal materials, such as the conductive features 145A, 145B, 145C, but not on dielectric materials, such as the dielectric layer 160 or the encapsulation layer 155. In some embodiments, a self-assembly monolayer comprises an organized layer of amphiphilic molecules in which one end of the molecule, the "head group," shows a specific, reversible affinity for a material. Generally, the head group is connected to an alkyl chain in which a tail or "terminal end" can be functionalized, for example, to vary wetting and interfacial properties. In one embodiment, the terminal end is functionalized to improve etch selectivity. In some embodiments, the head group may comprise an organosulfur compound, for example, di-n-alkyl sulfide, di-n-alkyl disulfides, 3 thiophenols, mercaptopyridines, mercaptoanilines, thiophenes, cysteines, xanthates, thiocarbaminates, thiocarbamates, thioureas, mercaptoimidazoles, alkanethiols, and alkaneselenols. In some embodiments, the head group comprises a thiol, a chloride, or a fluoride. In some embodiments, the head group is determined based on the material of the conductive features 145A, 145B, 145C.

In some embodiments, the blocking layer 170 is formed by chemisorption of the hydrophilic head groups onto the conductive features 145A, 145B, 145C, followed by a slow two-dimensional organization of hydrophobic tail groups. In some embodiments, self-assembly monolayer adsorption can occur from solution by immersion of the semiconductor device 100 into a dilute solution of an alkane thiol in ethanol. In some embodiments, adsorption occurs from a vapor phase. In some embodiments, the adsorbed molecules initially form a disordered mass of molecules and begin to form crystalline or semicrystalline structures on the conductive features 145A, 145B, 145C. Owing to the affinity of the head group of the self-assembly monolayer to the metal of the conductive features 145A, 145B, 145C, the self-assembly monolayer selectively deposits on the conductive features 145A, 145B, 145C, forming a metal complex. In some embodiments, the blocking layer 170 is deposited via spin-on coating from a solution of, for example, an alkane thiol in ethanol, among others. In some embodiments, a thickness of the blocking layer 170 is adjusted by adjusting the carbon chain length of the alkyl chain used. In some embodiments, the blocking layer 170 is formed by other suitable processes, such as CVD, ALD, spin-on coating, spray coating, electroless chemical deposition, for example. In some embodiments, the blocking layer 170 comprises a hydrophobic material that forms only on the conductive features 145A, 145B, 145C.

Figure 7:
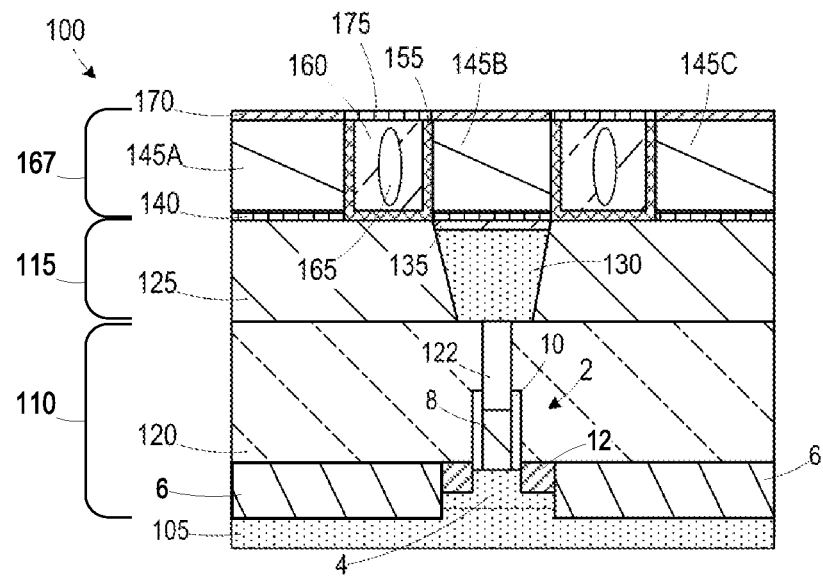

Referring to FIG. 7, an etch stop layer 175 is selectively formed over the dielectric layer 160, in accordance with some embodiments. In some embodiments, the etch stop layer 175 is formed over top surfaces of the encapsulation layer 155. In some embodiments, the etch stop layer 175 is formed to contact the top surfaces of the encapsulation layer 155 and top surfaces of the dielectric layer 160. In some embodiments, the etch stop layer 175 comprises a dielectric, such as at least one of an oxide or a nitride. In some embodiments, the etch stop layer 175 comprises an oxide or a nitride comprising at least one of Si, Al, Zr, Hf, Y, or other suitable material. In some embodiments, the etch stop layer 175 is formed by a deposition process, such as CVD, ALD, PVD, spin-on coating, or other suitable process. In some embodiments, the blocking layer 170 mitigates formation of the etch stop layer 175 over the conductive features 145A, 145B, 145C. In some embodiments, the etch stop layer 175 comprises a hydrophilic material and the blocking layer 170 comprises a hydrophobic material, thereby mitigating formation of the etch stop layer 175 over the blocking layer 170. In some embodiments, a thickness of the etch stop layer 175 is between less than 1 nm and about 10 nm.

Figure 8:
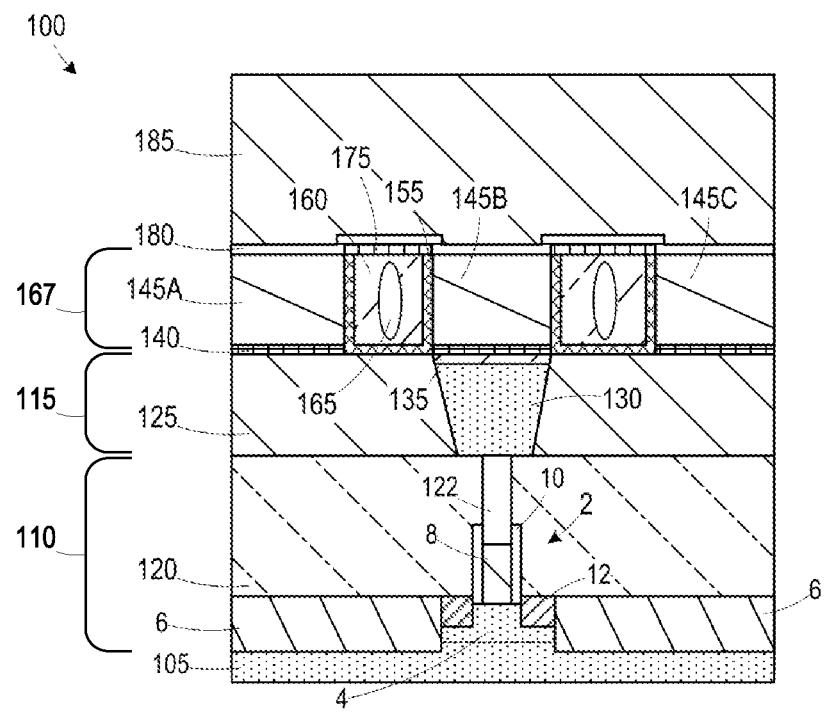

Referring to FIG. 8, the blocking layer 170 is removed, a cap layer 180 is formed over the conductive features 145A, 145B, 145C and the etch stop layer 175, and a dielectric layer 185 is formed over the cap layer 180, in accordance with some embodiments. In some embodiments, the cap layer 180 comprises SiN AlO, or other suitable material. In some embodiments, a material composition of the cap layer 180 is different than a material composition of the etch stop layer 175 such that the cap layer 180 has a different etch selectivity than the etch stop layer 175. In some embodiments, the cap layer 180 is formed at least one of CVD, ALD, PVD, pulsed laser deposition, sputtering, evaporative deposition, electroplating, electroless plating, or other suitable techniques. In some embodiments, the cap layer 180 is formed such that the cap layer 180 is adjacent sidewalls of the etch stop layer 175. In some embodiments, the cap layer 180 is formed such that the cap layer 180 contacts top surfaces of the conductive features 145A, 145B, 145C, sidewalls of the etch stop layer 175, and top surfaces of the etch stop layer 175.

In some embodiments, the dielectric layer 185 comprises one or more layers of a carbon-containing material, organosilicate glass, a porogen-containing material, or combinations thereof. The dielectric layer 185 comprises nitrogen in some embodiments. In some embodiments, the dielectric layer 185 comprises a same material composition as at least one of the dielectric layer 120, the dielectric layer 125, or the dielectric layer 160. In some embodiments, the material composition of the dielectric layer 185 is different than the material composition of the dielectric layer 120, the dielectric layer 125, and the dielectric layer 160. In some embodiments, the dielectric layer 185 is formed by using, for example, at least one of PECVD, LPCVD, ALCVD, or a spin-on coating technology.

Figure 9:
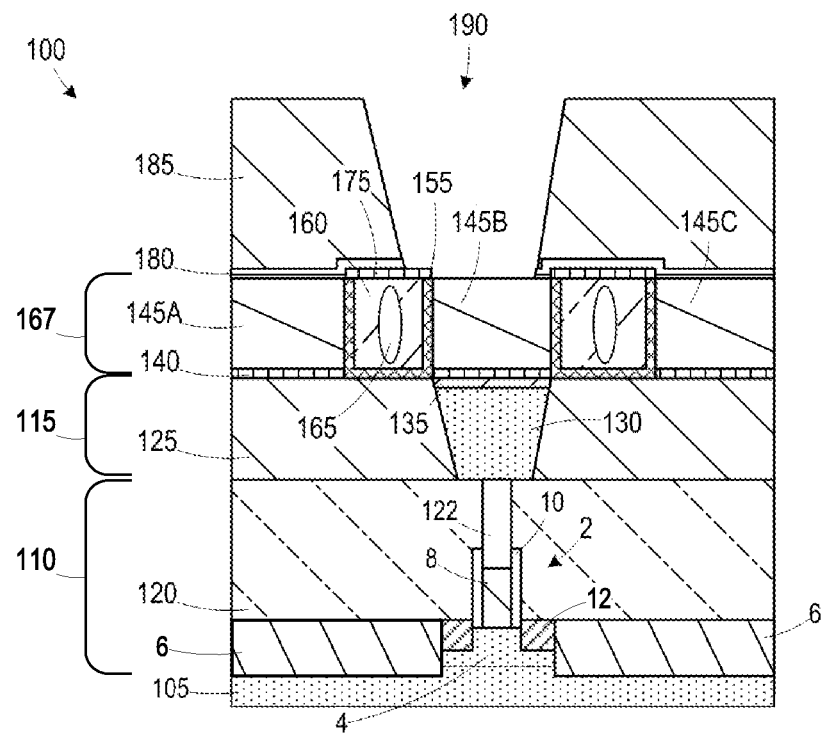

Referring to FIG. 9, a contact opening 190 is formed in the dielectric layer 185, in accordance with some embodiments. In some embodiments, the contact opening 190 is formed by performing an etch process in the presence of a patterned mask layer, such as a hard mask layer and a photolithography stack. In some embodiments, the photolithography stack comprises a BARC layer formed over the hard mask layer. In some embodiments, the BARC layer is a polymer layer that is applied using a spin-on coating process. In some embodiments, the photolithography stack comprises an OPL formed over the BARC layer. In some embodiments, the OPL layer comprises a photo-sensitive organic polymer that is applied using a spin-on coating process. In some embodiments, the OPL layer comprises a dielectric layer. In some embodiments, the photolithography stack comprises a photoresist layer over the OPL layer. In some embodiments, the photoresist layer comprises an electromagnetic radiation sensitive material and properties, such as solubility, of the photoresist layer are affected by electromagnetic radiation. The photoresist layer is either a negative photoresist or a positive photoresist. In some embodiments, portions of the OPL layer are irradiated by the electromagnetic radiation that patterns the photoresist layer to change the etch selectivity of the irradiated portions of the OPL layer with respect to non-irradiated portions. In some embodiments, the photoresist layer is exposed using a radiation source and a reticle to define a pattern in the photoresist layer. In some embodiments, portions of the photoresist layer are removed to define a patterned photoresist layer. In some embodiments, the underlying OPL layer and BARC layer are etched using the patterned photoresist layer as a template to form a patterned mask over the hard mask layer, and an etch process is performed to pattern the hard mask layer. In some embodiments, the photolithography stack is removed and an etch process is performed using the patterned hard mask layer as described above.

In some embodiments, the etch process is terminated using the cap layer 180. In some embodiments, an additional etch process is performed to remove portions of the cap layer 180 exposed by the contact opening 190 and positioned over the conductive feature 145B to expose the conductive feature 145B. In some embodiments, the etch process that forms the contact opening 190 also removes the exposed portions of the cap layer 180 using a single etch chemistry. In some embodiments, the etch stop layer 175 protects the dielectric layer 160 during the one or more etch processes employed to form the contact opening 190 and remove the cap layer 180 to expose the conductive feature 145B. In some embodiments, the contact opening 190 at least partially overlies a portion of the dielectric layer 160 due to the size of the contact opening 190 or due to alignment error in the patterning of the contact opening 190. In some embodiments, a top surface of the etch stop layer 175 is exposed during the one or more etch processes employed to form the contact opening 190 and remove the cap layer 180.

Figure 10:
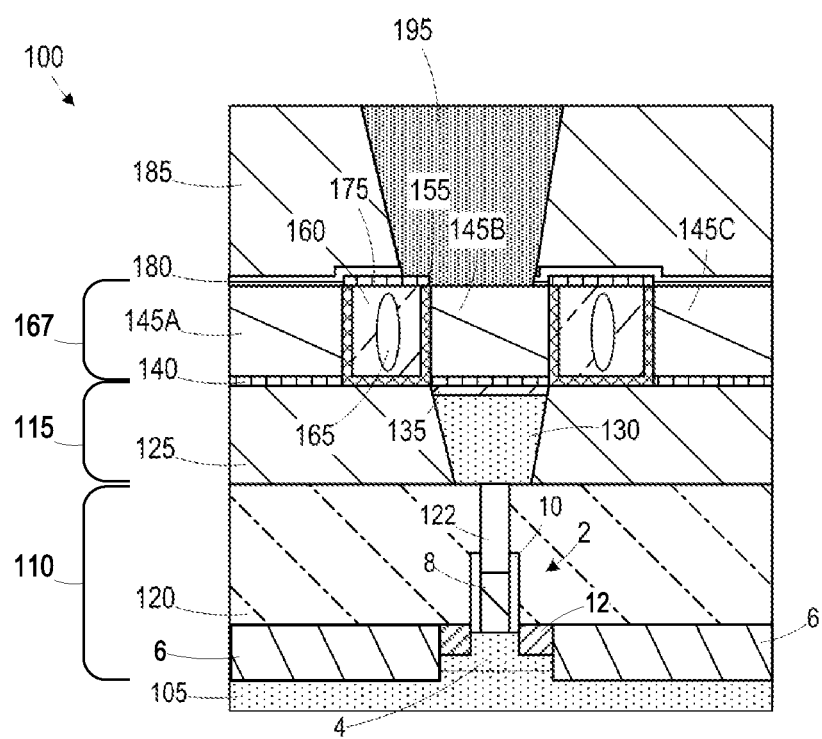

Referring to FIG. 10, a contact 195 is formed in the contact opening 190, in accordance with some embodiments. In some embodiments, the contact 195 is formed by depositing a conductive material in the contact opening 190 and over the dielectric layer 185. In some embodiments, a planarization process is performed after depositing the conductive material to remove portions of the conductive material positioned outside the contact opening 190. In some embodiments, the contact 195 comprises a metal. In some embodiments, the metal comprises tungsten, aluminum, copper, cobalt, or other suitable material. In some embodiments, the contact 195 comprises a silicide material. In some embodiments, the contact 195 comprises a plurality of layers, such as a barrier layer, a seed layer, and a conductive fill layer. In some embodiments, the contact 195 contacts the etch stop layer 175 and the conductive feature 145B. In some embodiments, the contact 195 contacts a top surface of the etch stop layer 175 and a top surface of the conductive feature 145B. In some embodiments, the contact 195 contacts a sidewall of the cap layer 180 and a sidewall of the etch stop layer 175.

In some embodiments, the presence of the etch stop layer 175 over the dielectric layer 160 mitigates punch through of the dielectric layer 160 into air gap 165 when forming the contact opening 190. If such punch through occurs, conductive material of the contact 195 may enter the air gap 165 and generate issues such as short circuits, increased leakage, breakdown voltage issues, and time-dependent dielectric breakdown issues.

In some embodiments, a semiconductor device includes a first conductive feature, a second conductive feature, and a first dielectric layer positioned between the first conductive feature and the second conductive feature. An etch stop layer is over the first dielectric layer. A cap layer is over the first conductive feature, the second conductive feature, and the etch stop layer. The cap layer is adjacent a sidewall of the etch stop layer.

In some embodiments, a method of forming a semiconductor device includes forming a first conductive feature and forming a first dielectric layer adjacent the first conductive feature. A blocking layer is selectively formed on a top surface of the first conductive feature. A top surface of the first conductive feature remains exposed after forming the blocking layer. An etch stop layer is formed on a top surface of the first dielectric layer while the blocking layer is positioned on the top surface of the first conductive feature. The blocking layer is removed. A second dielectric layer is formed over the etch stop layer and the first conductive feature after removing the blocking layer. A contact extending through at least a portion of the second dielectric layer is formed.

In some embodiments, a method of forming a semiconductor device includes forming a first conductive feature and a second conductive feature. A first dielectric layer is formed between the first conductive feature and the second conductive feature. An air gap is defined in the first dielectric layer. A blocking layer is selectively formed on a top surface of the first conductive feature and a top surface of the second conductive feature. An etch stop layer is formed on a top surface of the first dielectric layer after selectively forming the blocking layer. The blocking layer is removed after forming the etch stop layer. A second dielectric layer is formed over the etch stop layer, the first conductive feature, and the second conductive feature after removing the blocking layer. A contact opening is formed in the second dielectric layer to expose the first conductive feature and a portion of the etch stop layer. A contact is formed in the contact opening.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on coating techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a first conductive feature;
   a second conductive feature;
   a first dielectric layer positioned between the first conductive feature and the second conductive feature;
   an air gap defined in a portion of the first dielectric layer;
   an etch stop layer over the first dielectric layer;
   a cap layer over the first conductive feature, the second conductive feature, and the etch stop layer, wherein the cap layer is adjacent a first sidewall of the etch stop layer; and
   a contact overlying the portion of the first dielectric layer positioned between the first conductive feature and the second conductive feature, wherein the contact is separated from the portion of the first dielectric layer by the etch stop layer.

2. The semiconductor device of claim 1, wherein the cap layer is in contact with the first sidewall of the etch stop layer and a top surface of the first conductive feature.

3. The semiconductor device of claim 1, comprising:
   a second dielectric layer positioned over the cap layer, wherein:
   the contact is positioned in the second dielectric layer, and
   the contact is in contact with a top surface of the second conductive feature and a top surface of the etch stop layer.

4. The semiconductor device of claim 1, wherein the contact is in direct contact with a sidewall of the cap layer and a second sidewall of the etch stop layer.

5. The semiconductor device of claim 1, comprising:
   an encapsulation layer adjacent a sidewall of the second conductive feature, wherein the etch stop layer is over a top surface of the encapsulation layer.

6. The semiconductor device of claim 1, comprising:
   a second dielectric layer positioned under the first dielectric layer; and
   a third conductive feature positioned in the second dielectric layer and underlying the second conductive feature.

7. The semiconductor device of claim 1, wherein:
   the contact in direct contact with a top surface of the etch stop layer and electrically coupled to the second conductive feature.

8. The semiconductor device of claim 1, wherein the cap layer comprises a first material, and the etch stop layer comprises a second material different than the first material.

9. The semiconductor device of claim 1, wherein the etch stop layer comprises a hydrophilic material.

10. The semiconductor device of claim 1, wherein the contact is in direct contact with a sidewall of the cap layer.

11. A method of forming a semiconductor device comprising:
    forming a first conductive feature;
    forming a first dielectric layer adjacent the first conductive feature;
    selectively forming a blocking layer on a top surface of the first conductive feature, wherein a top surface of the first dielectric layer remains exposed after forming the blocking layer;
    forming an etch stop layer on the top surface of the first dielectric layer while the blocking layer is positioned on the top surface of the first conductive feature;
    removing the blocking layer;
    forming a second dielectric layer over the etch stop layer and the first conductive feature after removing the blocking layer; and
    forming a contact extending through at least a portion of the second dielectric layer.

12. The method of claim 11, wherein forming the contact comprises:
    forming the contact to contact a portion of the first conductive feature and a portion of the etch stop layer positioned over the first dielectric layer.

13. The method of claim 11, comprising:
    forming a cap layer over the first conductive feature and the etch stop layer, wherein the cap layer is adjacent a first sidewall of the etch stop layer.

14. The method of claim 11, wherein forming the contact comprises:
    forming a contact opening in the second dielectric layer to expose a portion of the etch stop layer and a portion of the first conductive feature; and
    forming a conductive material in the contact opening.

15. The method of claim 11, wherein forming the first dielectric layer comprises:
    forming the first dielectric layer to define an air gap adjacent the first conductive feature.

16. A method of forming a semiconductor device, comprising:
    forming a first conductive feature and a second conductive feature;

forming a first dielectric layer between the first conductive feature and the second conductive feature, wherein an air gap is defined in the first dielectric layer;

selectively forming a blocking layer on a top surface of the first conductive feature and a top surface of the second conductive feature;

forming an etch stop layer on a top surface of the first dielectric layer after selectively forming the blocking layer;

removing the blocking layer after forming the etch stop layer;

forming a second dielectric layer over the etch stop layer, the first conductive feature, and the second conductive feature after removing the blocking layer;

forming a contact opening in the second dielectric layer to expose the first conductive feature and a portion of the etch stop layer; and forming a contact in the contact opening.

17. The method of claim 16, comprising:

forming a cap layer over the first conductive feature, the second conductive feature, and the etch stop layer before forming the second dielectric layer, wherein forming the contact opening comprises:

removing a portion of the cap layer overlying the first conductive feature and a portion of the cap layer overlying the etch stop layer.

18. The method of claim 17, wherein forming the contact comprises:

forming the contact to contact the top surface of the first conductive feature, a top surface of the etch stop layer, and a sidewall of the cap layer.

19. The method of claim 17, wherein the top surface of the first conductive feature and the top surface of the second conductive feature are exposed after removing the blocking layer and before forming the cap layer.

20. The method of claim 16, wherein forming the contact comprises forming the contact to contact with a sidewall of the etch stop layer.

\* \* \* \* \*